United States Patent
Kawano et al.

(10) Patent No.: US 8,372,688 B2
(45) Date of Patent: Feb. 12, 2013

(54) METHOD FOR FORMING GE-SB-TE FILM AND STORAGE MEDIUM

(75) Inventors: Yumiko Kawano, Nirasaki (JP); Susumu Arima, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/376,749

(22) PCT Filed: Jun. 2, 2010

(86) PCT No.: PCT/JP2010/059337
§ 371 (c)(1),
(2), (4) Date: Jan. 13, 2012

(87) PCT Pub. No.: WO2010/143570
PCT Pub. Date: Dec. 16, 2010

(65) Prior Publication Data
US 2012/0108005 A1 May 3, 2012

(30) Foreign Application Priority Data
Jun. 9, 2009 (JP) .................................. 2009-138274

(51) Int. Cl.
*H01L 21/06* (2006.01)
(52) U.S. Cl. .......................................... 438/102; 438/84
(58) Field of Classification Search ................ 438/3, 84, 438/102, 103; 257/42
See application file for complete search history.

(56) References Cited

U.S. PATENT DOCUMENTS

| | | |
|---|---|---|
| 2008/0108175 A1 | 5/2008 | Shin et al. |
| 2008/0154410 A1 | 6/2008 | Nakamura |
| 2009/0124039 A1* | 5/2009 | Roeder et al. .................. 438/99 |
| 2009/0253270 A1* | 10/2009 | Lavoie et al. ................. 438/768 |
| 2010/0009078 A1* | 1/2010 | Pore et al. ................ 427/255.28 |

FOREIGN PATENT DOCUMENTS

| | | |
|---|---|---|
| JP | 2007 258440 | 10/2007 |
| JP | 2008 103731 | 5/2008 |
| JP | 2008 159787 | 7/2008 |

OTHER PUBLICATIONS

International Search Report Issued Jul. 6, 2010 in PCT/JP10/59337 Filed Jun. 2, 2010.

* cited by examiner

*Primary Examiner* — Kevin M Picardat
(74) *Attorney, Agent, or Firm* — Rothwell, Figg, Ernst & Manbeck, P.C.

(57) ABSTRACT

A film-forming method includes a preprocessing step (step 1) wherein the inside of a processing chamber is exposed to a gas containing Cl and/or F in a state having no substrate in the processing chamber, and a step (step 2) wherein a substrate is loaded into the processing chamber after the step 1. Then, in a step 3, a gaseous Ge raw material, a gaseous Sb raw material, and a gaseous Te raw material are introduced into the processing chamber having the substrate loaded therein, and a Ge—Sb—Te film formed of $Ge_2Sb_2Te_5$ is formed on the substrate by CVD.

6 Claims, 5 Drawing Sheets

METHOD FOR FORMING GE-SB-TE FILM AND STORAGE MEDIUM

FIELD OF THE INVENTION

The present invention relates to a film forming method for forming a Ge—Sb—Te film by CVD, and a storage medium storing a program for performing the film forming method.

BACKGROUND OF THE INVENTION

Recently, a PRAM (Phase-change Random Access Memory) which stores information by using a phase-change film attracts attention as a high-speed and long-life nonvolatile memory. The phase-change film is made of a material that changes its phase to an amorphous state having a high resistivity when it is heated at a high temperature (e.g., about 600° C. or above) and rapidly cooled, and to a crystalline state having a normal resistivity when it is heated at a low temperature (e.g., about 400° C. or above) and slowly cooled. The PRAM stores data by using the resistance difference between the two phases. The phase change is realized by controlling an amplitude of a current pulse. In other words, the phase is changed to the amorphous phase by applying a large current pulse and to the crystalline state by applying a small current pulse.

As for the material of the phase-change film used for the PRAM, $Ge_2Sb_2Te_5$, a Ge—Sb—Te film, is used (e.g., Japanese Patent Application Publication No. 2008-103731). The Ge—Sb—Te film is generally formed by PVD such as sputtering or the like. Since, however, PVD yields insufficient step coverage, attempts have been made to apply CVD which provides good step coverage for film formation.

When the Ge—Sb—Te film is formed by CVD by using a Ge compound, a Sb compound and a Te compound as a film forming raw material, it has been found that smoothness of a film surface is deteriorated.

SUMMARY OF THE INVENTION

In view of the above, the present invention provides a film forming method capable of forming a Ge—Sb—Te film having high smoothness by CVD.

The present invention also provides a storage medium storing a program for performing such the film forming method.

The present inventors have found that when a Ge—Sb—Te film formed of a $Ge_2Sb_2Te_5$ is formed by CVD by using a gaseous Ge raw material, a gaseous Sb raw material and a gaseous Te raw material, the film has poor surface smoothness due to a sparse distribution of coarse crystal grains having a strong crystal habit. However, the present inventors have also found that the smoothness is improved when a Ge—Sb—Te film is formed after cleaning using $ClF_3$ is performed in the processing chamber. As a result of further examination, the present inventors have concluded that a film having high smoothness and dense distribution of comparatively small crystal grains can be formed by performing the steps of: exposing the inside of the processing chamber to a gas containing at least one of Cl and F; loading a substrate into the processing chamber; and introducing a gaseous Ge raw material, a gaseous Sb raw material and a gaseous Te raw material. This is because the reaction between the raw materials and at least one of Cl and F causes generation of active chloride or fluoride having a high vapor pressure, and this facilitates the formation of initial nucleus.

In accordance with one aspect of the present invention, there is provided a film forming method including: exposing the inside of a processing chamber to a gas containing at least one of Cl and F before loading a substrate into the processing chamber; loading a substrate into the processing chamber; and introducing a gaseous Ge raw material, a gaseous Sb raw material and a gaseous Te raw material into the processing chamber where the substrate is loaded and forming a Ge—Sb—Te film formed of $Ge_2Sb_2Te_5$ on the substrate by CVD.

In accordance with another aspect of the present invention, there is provided a storage medium storing a program for controlling a film forming apparatus, wherein the program, when executed on a computer, controls the film forming apparatus to perform a film forming method of a Ge—Sb—Te film which includes: exposing the inside of a processing chamber to a gas containing at least one of Cl and F before loading a substrate into processing chamber; loading a substrate into the processing chamber; and introducing a gaseous Ge raw material, a gaseous Sb raw material and a gaseous Te raw material into the processing chamber where the substrate is loaded and forming a Ge—Sb—Te film formed of $Ge_2Sb_2Te_5$ on the substrate by CVD.

DETAILED DESCRIPTION OF THE EMBODIMENTS

Hereinafter, an embodiment of the present invention will be described with reference to the accompanying drawings.

Here, the case in which a Ge—Sb—Te film is formed, as a phase-change film of a PRAM, on a semiconductor wafer will be described.

Figure 1:
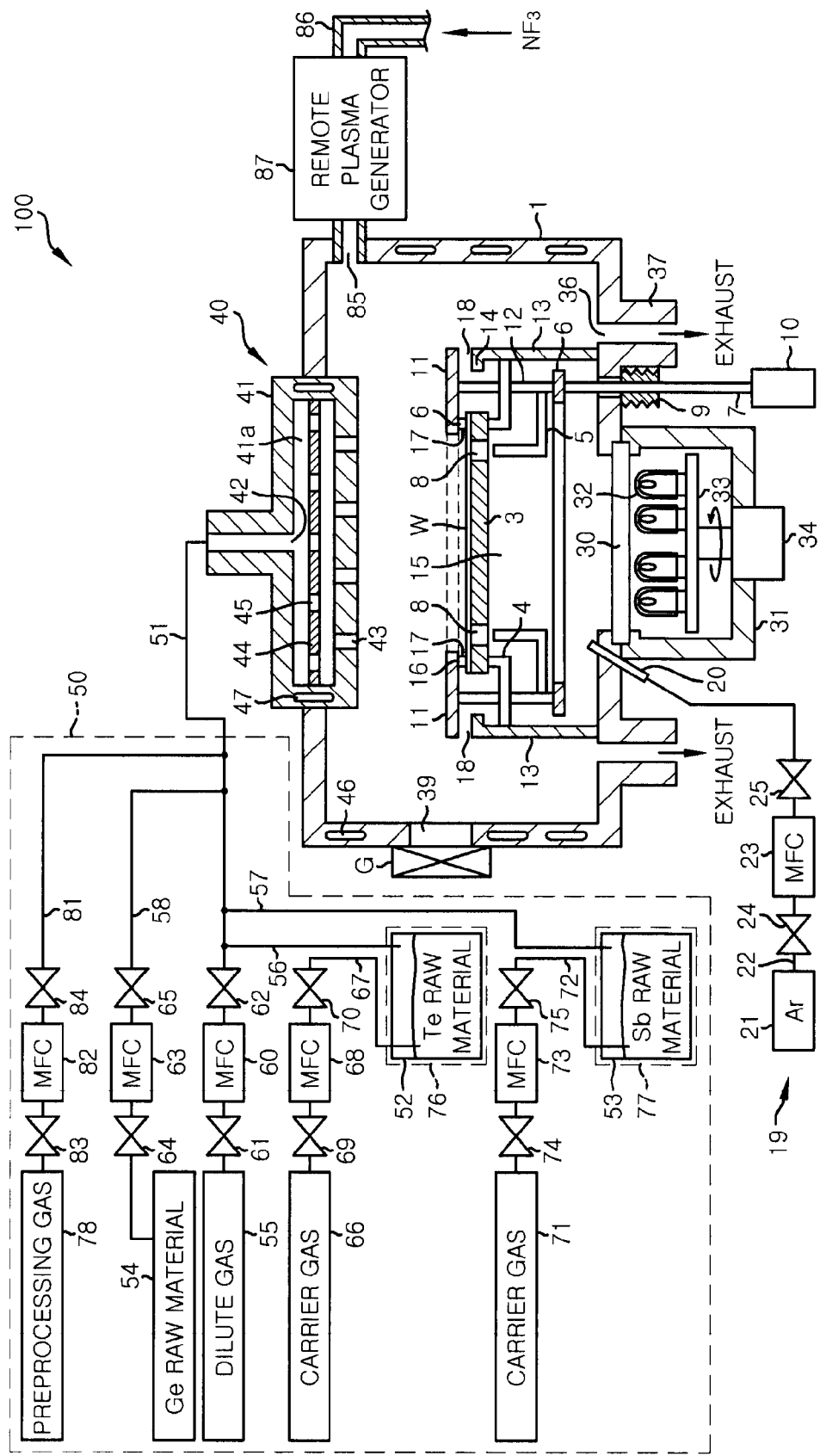
FIG. 1 is a cross sectional view showing a schematic configuration of a film forming apparatus which can be used to perform a Ge—Sb—Te film forming method of the present invention.

FIG. 1 is a cross sectional view showing a schematic configuration of a film forming apparatus which can be used to perform a Ge—Sb—Te film forming method of the present invention. A film forming apparatus 100 shown in FIG. 1 includes a cylindrical or a box-shaped processing chamber 1 made of, e.g., aluminum or the like. Provided in the processing chamber 1 is a mounting table 3 for mounting thereon a semiconductor wafer (hereinafter, simply referred to as a "wafer") W as a substrate to be processed. The mounting table 3 having a thickness of about 1 mm is made of a carbon material such as a graphite plate or a graphite plate covered with SiC, and a ceramic having high thermal conductivity such as aluminum nitride or the like.

A cylindrical partition wall 13 made of, e.g., aluminum, stands on a bottom portion of the processing chamber 1 at an outer peripheral side of the mounting table 3. A bent portion 14 is formed by horizontally bending an upper portion of the partition wall 13 in an L shape, for example. By installing the cylindrical partition wall 13, an inert gas purge area 15 is formed at a backside of the mounting table 3. A top surface of the bent portion 14 is positioned substantially on the same plane as a top surface of the mounting table 3, and is spaced apart from the outer periphery of the mounting table 3 with connection rods 12 inserted therebetween. The mounting table 3 is supported by three support arms 4 (only two being shown) extending from an upper inner wall of the partition wall 13.

A plurality of, e.g., three, L-shaped lifter pins 5 (only two being shown) is provided under the mounting table so as to protrude upward from the ring-shaped support member 6. The support member 6 can be raised or lowered by an elevation rod 7 passing through the bottom portion of the processing chamber 1, and the elevation rod 7 is vertically moved by an actuator 10 positioned below the processing chamber 1. Through holes 8 are formed at portions of the mounting table 3 which correspond to the lifter pins 5. When the lifter pins 5 are raised by the actuator 10 through the elevation rod 7 and the support member 6, the lifter pins 5 are inserted into the respective through holes 8 to thereby lift the wafer W. The portion of the processing chamber 1 into which the elevation rod 7 is inserted is covered with a bellows 9 to prevent air from entering the processing chamber 1 through this portion.

A clamp ring member 11 made of ceramic, e.g., aluminum nitride or the like, and having a substantially ring-shape conforming to a peripheral shape of the wafer W is provided at a peripheral portion of the mounting table 3 so as to hold and fix the peripheral portion of the wafer W onto the mounting table 3. The clamp ring member 11 is connected to the support member 6 via the connection rods 12, and thus can be moved up and down together with the lifter pins 5. The lifter pins 5, the connection rods 12 and the like are made of ceramic such as alumina or the like.

A plurality of contact protrusions 16 is formed at a bottom backside surface of an inner peripheral side of the clamp ring member 11 while being spaced from each other at a substantially regular interval in a circumferential direction of the clamp ring member 11. When the wafer W is clamped, bottom surfaces of the contact protrusions 16 come into contact with the top surface of the peripheral portion of the wafer W to thereby press the wafer W. Further, each of the contact protrusions 16 has a diameter of about 1 mm and a height of about 50 μm, so that a first gas purge gap 17 having a ring shape is formed at this portion when the wafer W is clamped. Moreover, an overlapping amount (a passage length of the first gas purge gap 17) between the peripheral portion of the wafer W and the inner periphery of the clamp ring 11 during clamping is several millimeters (mm).

An outer peripheral portion of the clamp ring member 11 is arranged above the upper bent portion 14 of the partition wall 13, and a second gas purge gap 18 having a ring shape is formed therebetween. The width (height) of the second gas purge gap 18 is about 500 μm, which is about ten times larger than the width of the first gas purge gap 17. An overlapping amount between the outer peripheral portion of the clamp ring member 11 and the bent portion 14 (a passage length of the second gas purge gap 18) is, e.g., about 10 mm. Accordingly, inert gases in the inert gas purge area 15 can be discharged through both gaps 17 and 18 into a processing space.

An inert gas supply mechanism 19 for supplying an inert gas to the inert gas purge area 15 is provided at the bottom portion of the processing chamber 1. The inert gas supply mechanism 19 includes: a gas nozzle 20 for introducing an inert gas, e.g., Ar gas (backside Ar), into the inert gas purge area 15; an Ar gas supply source 21 for supplying Ar gas as the inert gas; and a gas line 22 for feeding Ar gas from the Ar gas supply source 21 to the gas nozzle 20. Further, the gas line 22 is provided with a mass flow controller 23 serving as a flow rate controller, and opening/closing valves 24 and 25. Instead of Ar gas, a rare gas such as He gas or the like may be used as the inert gas.

A transmission window 30 made of a heat ray transmission material such as quartz or the like is airtightly provided directly below the mounting table 3 at the bottom portion of the processing chamber 1, and a box-shaped heating chamber 31 is arranged therebelow so as to surround the transmission window 30. The heating chamber 31 has therein a plurality of heating lamps 32 serving as a heating unit, which are installed on a rotatable table 33 serving as a reflective mirror as well. The rotatable table 33 is rotated by a rotating motor 34 provided at a bottom portion of the heating chamber 31 through a rotation axis. Accordingly, heat rays emitted from the heating lamps 32 are irradiated to the backside of the mounting table 3 through the transmission window 30, thereby heating the mounting table 3.

Furthermore, a gas exhaust port 36 is provided at a peripheral portion of the bottom portion of the processing chamber 1. The gas exhaust port 36 is connected to a gas exhaust line 37 connected to a vacuum pump (not shown). By exhausting gases through the gas exhaust port 36 and the gas exhaust line 37, a pressure in the processing chamber 1 can be maintained at a predetermined vacuum level. Formed at a sidewall of the processing chamber 1 are a loading/unloading port 39 for loading and unloading a wafer W and a gate valve 38 for opening and closing the loading/unloading port 39. Besides, the processing chamber 1 is connected to a transfer chamber of a processing system to be described later via the gate valve G.

Meanwhile, a shower head 40 for supplying a source gas or the like into the processing chamber 1 is provided at a ceiling portion of the processing chamber 1 which faces the mounting table 3. The shower head 40 includes a disc-shaped shower head main body 41 which is made of, e.g., aluminum, and has a space 41a therein. A gas inlet port 42 is provided at a ceiling portion of the shower head main body 41. The gas inlet port 42 is connected, through a line 51, to a processing gas supply mechanism 50 for supplying processing gases required to form a Ge—Sb—Te-based film. A plurality of gas injection holes 43 for injecting the gas supplied into the shower head main body 41 to the processing space provided in the processing chamber 1 is formed over the entire surface of the bottom portion of the shower head main body 41, so that the gas is injected onto the entire surface of the wafer W. Further, a diffusion plate 44 having a plurality of gas distribution holes 45 is disposed in the space 41a of the shower head main body 41, so that the gas can be more uniformly supplied to the surface of the wafer W. Moreover, cartridge heaters 46 and 47 for temperature control are installed in the sidewall of the processing chamber 1, the sidewall of the shower head 40 and the wafer facing surface of the shower head 40 where the gas injection holes 43 are provided, so that the sidewall of the processing chamber 1 and portions of the shower head which contact with the gas can be maintained at a predetermined temperature.

The processing gas supply mechanism 50 includes a Te raw material reservoir 52 for storing a Te raw material, an Sb raw material reservoir 53 for storing an Sb raw material, a Ge raw material reservoir 54 for storing a Ge raw material, a dilute gas supply source 55 for supplying a dilute gas, e.g., Ar gas, for diluting the gas in the processing chamber 1, and a preprocessing gas supply source 78 for supplying a preprocessing gas for performing preprocessing. In addition, the processing gas supply mechanism 50 may be configured to supply $NH_3$ gas and $H_2$ gas as additional gases for improving a film quality.

The line 51 connected to the shower head 40 is connected to a line 56 extending from the Te raw material reservoir 52, a line 57 extending from the Sb raw material reservoir 53, a line 58 extending from the Ge raw material reservoir 54, and a line 81 extending from the preprocessing gas supply source 78. The line 51 is also connected to the dilute gas supply source 55. The line 51 is provided with a mass flow controller (MFC) 60 serving as a flow rate controller, and valves 61 and 62 disposed at an upstream and a downstream side thereof. Further, the line 58 is provided with a mass flow controller (MFC) 63 serving as a flow rate controller and valves 64 and 65 located at an upstream and a downstream side thereof. Furthermore, the line 81 is provided with a mass flow controller (MFC) 82 serving as a flow rate controller and valves 83 and 84 located at an upstream and a downstream side thereof.

The Te raw material reservoir 52 is connected via the line 67 to a carrier gas supply source 66 for supplying a carrier gas for bubbling, e.g., Ar gas or the like. The line 67 is provided with a mass flow controller (MFC) 68 serving as a flow rate controller, and valves 69 and 70 located at an upstream and a downstream side thereof. Moreover, the Sb raw material reservoir 53 is connected via the line 72 to a carrier gas supply source 71 for supplying a carrier gas such as Ar gas or the like. The line 72 is provided with a mass flow controller (MFC) 73 serving as a flow rate controller, and valves 74 and 75 located at an upstream and a downstream side thereof. The Te raw material reservoir 52 and the Sb raw material reservoir 53 are provided with heaters 76 and 77, respectively. Besides, the Te raw material stored in the Te raw material reservoir 52 and the Sb raw material stored in the Sb raw material reservoir 53 are supplied to the processing chamber 1 through bubbling while being heated by the heaters 76 and 77. Further, the Ge raw material stored in the Ge raw material reservoir 54 is supplied to the processing chamber 1 at a flow rate controlled by the mass flow controller (MFC) 63. Although it is not shown, mass flow controllers or lines for supplying the Ge raw material, the Sr raw material or the Ti raw material in a vaporized state to the processing chamber 1 are also provided with heaters.

The present embodiment has described an example in which the Ge raw material is supplied through the mass flow controller and the Sb raw material and the Te raw material are supplied by bubbling. However, the Ge raw material may be supplied by bubbling, and the Sb raw material and the Te raw material may be supplied through the mass flow controllers. Besides, a liquid raw material having a flow rate controlled by a liquid mass flow controller may be vaporized by a vaporizer and supplied in a gaseous state.

As for the Ge raw material, the Sb raw material and the Te raw material, a compound that can be supplied in a gaseous state can be used. A compound having a high vapor pressure is preferably used because it is easily vaporized. A compound having an alkyl group can be preferably used due to its high vapor pressure and low cost. However, such compound is not limited to a compound having an alkyl group.

The Ge raw material having an alkyl group may be methyl germanium [$Ge(CH_3)H_3$], tertiary butyl germanium [$Ge((CH_3)_3C)H_3$], tetra methyl germanium [$Ge(CH_3)_4$], tetra ethyl germanium [$Ge(C_2H_5)_4$], tetra dimethyl amino germanium [$Ge((CH_3)_2N)_4$], or the like. The Sb raw material having an alkyl group may be triisopropyl antimony [$Sb(i-C_3H_7)_3$], trimethyl antimony [$Sb(CH_3)_3$], trisdimethyl amino antimony [$Sb((CH_3)_2N)_3$], or the like. The Te raw material having an alkyl group may be diisopropyl tellurium [$Te(t-C_3H_7)_2$], ditertiary butyl tellurium [$Te(t-C_4H_9)_2$], diethyl tellurium [$Te(C_2H_5)_2$], or the like.

The preprocessing gas supplied from the preprocessing gas supply source 78 is used to preprocess, before the formation of a Ge—Sb—Te film, the inside of the processing chamber 1 having no wafer W therein. As for the preprocessing gas, a gas containing at least one of Cl and F is used. The gas containing at least one of Cl and F may be $ClF_3$ gas, $F_2$ gas, $Cl_2$ gas or the like. The flow rate of such gas is preferably in a range from about 200 mL/min (sccm) to 1000 mL/min (sccm), or the partial pressure thereof is preferably in a range from about 133 Pa to 399 Pa. When $ClF_3$ gas is used as the preprocessing gas, it can also serve as a cleaning gas for cleaning the inside of the processing chamber 1. In addition to the gas containing at least one of Cl and F, an inert gas such as dilute Ar gas or the like can be supplied as the preprocessing gas.

Figure 2:
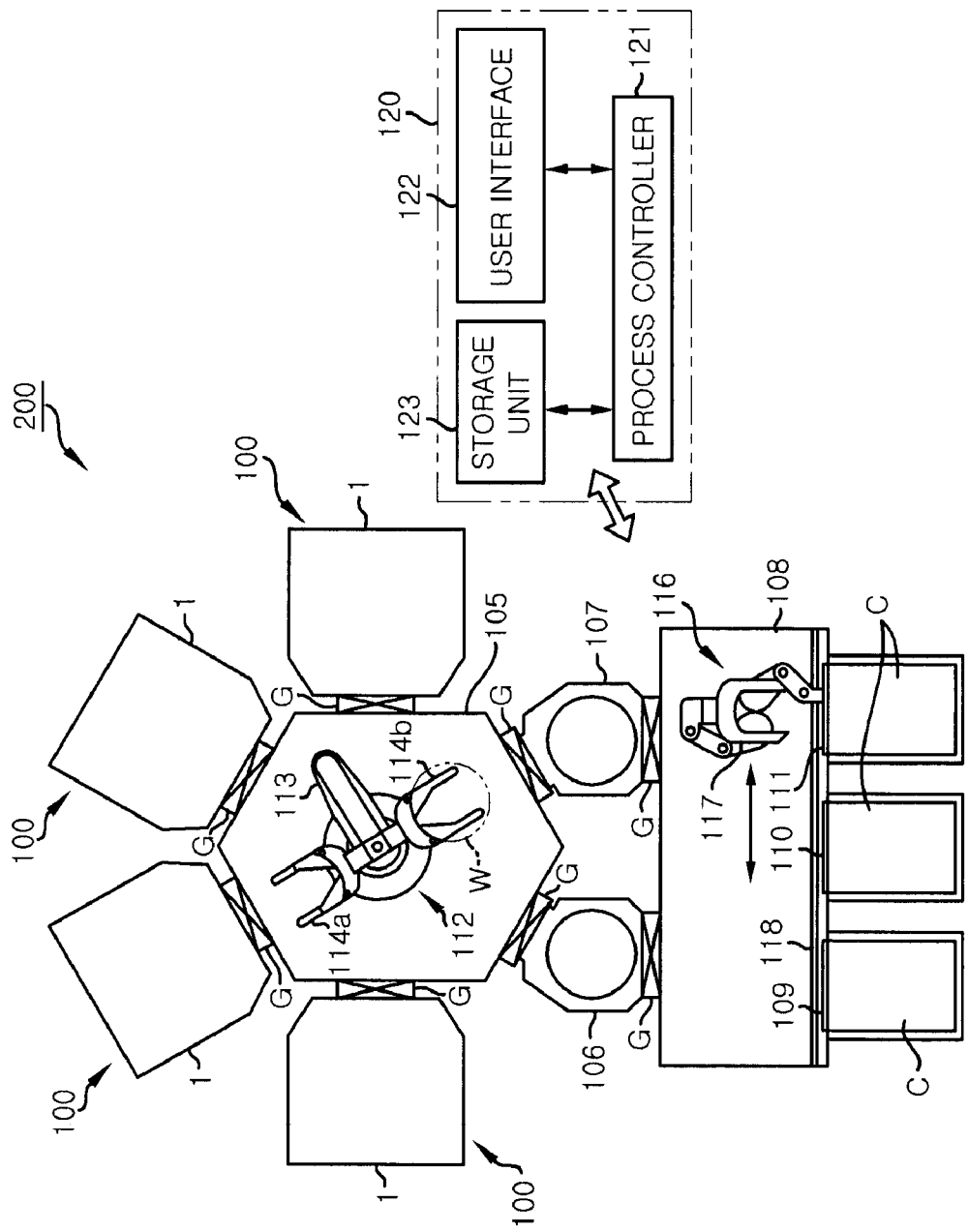
FIG. 2 is a schematic diagram showing a multi-chamber type processing system including a plurality of film forming apparatuses of FIG. 1.

Formed at an upper sidewall of the processing chamber 1 is a cleaning gas inlet port 85 for introducing $NF_3$ gas as a cleaning gas. The cleaning gas inlet port 85 is connected to a line 86 for supplying $NF_3$ gas. The line 86 is provided with a remote plasma generator 87. The $NF_3$ gas supplied through the line 86 is turned into a plasma in the remote plasma generator 87 and supplied into the process chamber 1, thereby cleaning the processing chamber 1. Moreover, the remote plasma generator 87 may be provided directly above the shower head 40 so that a cleaning gas can be supplied through the shower head 40. Besides, $F_2$ may be used instead of $NF_3$, and plasma-less thermal cleaning using $ClF_3$ or the like may be performed without using a remote plasma. The actual process for forming a Ge—Sb—Te film is performed by a multi-chamber type processing system including a plurality of film forming apparatuses 100 and a mechanism for transferring a wafer W. Hereinafter, this processing system will be described. FIG. 2 is a schematic diagram showing a processing system 200 including a plurality of film forming apparatuses 100.

The processing system 200 includes four film forming apparatuses 100. The processing chambers 1 of the film forming apparatuses 100 are connected to a transfer chamber 105 maintained in a vacuum state via gate valves G. Further, load-lock chambers 106 and 107 are connected to the transfer chamber 105 via gate valves G. A loading/unloading chamber 108 in an atmospheric atmosphere is disposed at the side of the load-lock chambers 106 and 107 which is opposite to the side where the transfer chamber 105 is provided. Three carrier attachment ports 109, 110 and 111 to which carriers C capable of accommodating therein wafers W are attached are provided at the side of the loading/unloading chamber 108 which is opposite to the side where the load-lock chambers 106 and 107 are connected.

Provided in the transfer chamber 105 is a transfer device 112 for loading and unloading wafers W into and from the processing chambers 1 of the four film forming apparatuses 100 and the two load-lock chambers 106 and 107. The transfer device 112 is provided substantially at the center of the transfer chamber 105, and has at a leading end of a rotatable and extensible/contractible portion two support arms 114a and 114b for supporting wafers W. The two support arms 114a and 114b are attached to the rotation and extensible/contractible portion 113 so as to face in opposite directions.

Provided in the loading/unloading chamber 108 is a transfer device 116 for loading and unloading wafers W into and from the carriers C and the load-lock chambers 106 and 107. The transfer device 116 has a multi-joint arm structure, and can move on a rail 118 along the arrangement direction of the carriers C. The transfer device 116 transfers wafers W mounted on the support arm 117 provided at the leading end thereof.

The processing system 200 includes a control unit 120. The control unit 120 has a process controller 121 provided with a micro processor, a user interface 122 and a storage unit 123. The components of the processing system 200 are electrically connected to and controlled by the process controller 121. For example, the actuator 10, the lamp 32, the rotation motor 34, the valves, the mass flow controllers and the like of the film forming apparatus 100 are controlled by the process controller 121.

The process controller 121 is connected to the user interface 122 including a keyboard through which an operator inputs commands for managing the processing system 200 and a display for visually displaying operation states of the plasma processing apparatuses.

The process controller 121 is connected to the storage unit 123 storing therein control programs to be used in realizing various processes performed by the processing system 200 under the control of the process controller 121, or programs, i.e., recipes to be used in performing a process in each component of the processing system 200 under processing conditions. The recipes are stored in a storage medium of the storage unit 123. The storage medium may be a fixed device such as a hard disk or the like, or a portable device such as a CD-ROM, a DVD, a flash memory or the like. Besides, the recipes may be properly transmitted from other devices via, e.g., a dedicated line.

If necessary, any one of the recipes is read out from the storage unit 123 in accordance with an instruction inputted from the user interface 122 and executed by the process controller 121. Accordingly, processes in the processing system 200, i.e., a wafer transfer process and a Ge—Sb—Te film forming process in film forming apparatus 100, are performed under the control of the process controller 121.

Figure 3:
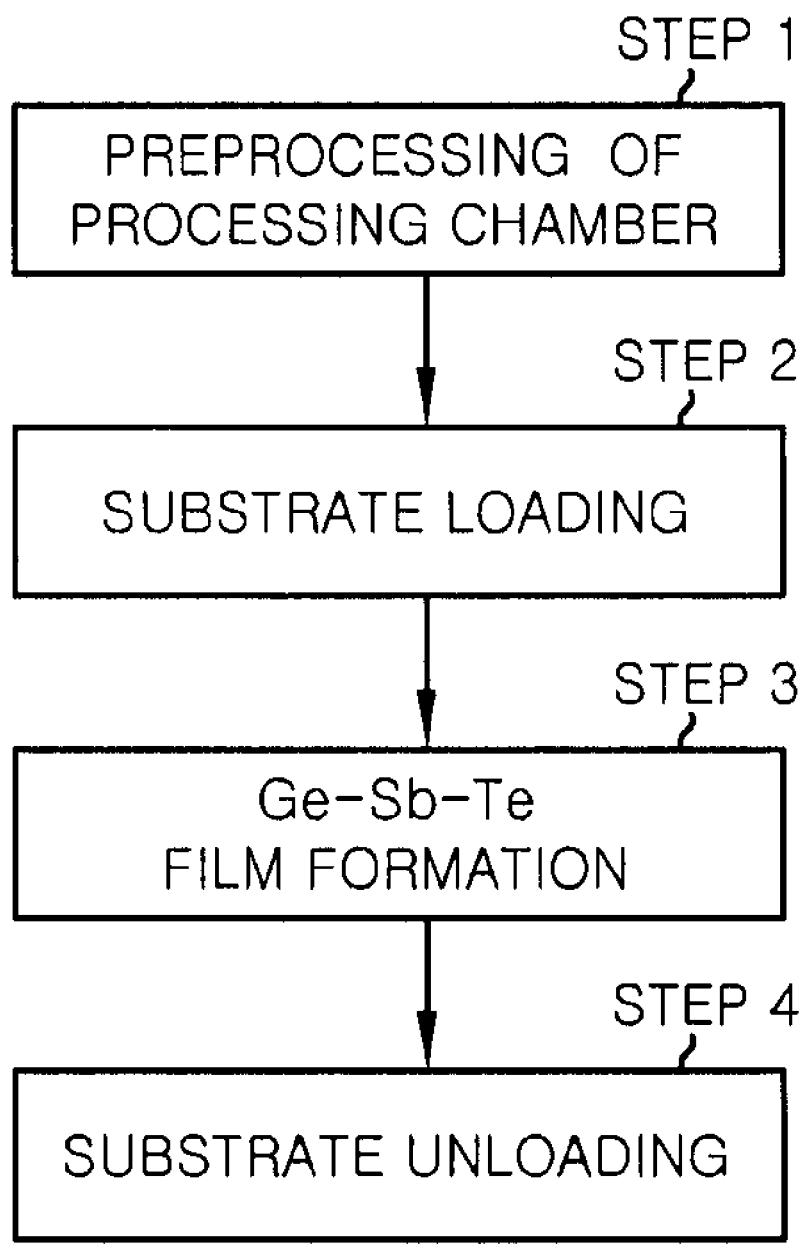
FIG. 3 is a flowchart for explaining a film forming method of the present invention.

Hereinafter, the film forming method of the present embodiment will be described with reference to the flowchart shown in FIG. 3.

A wafer W is loaded into any one of the load-lock chambers 106 and 107 from a carrier C by the transfer device 116 of the loading/unloading chamber 108. The corresponding load-lock chamber is set in a standby state after vacuum evacuation. Next, a film forming process is started.

First, before the wafer W is loaded, a preprocessing gas is introduced from the preprocessing gas supply source 78 into a processing chamber 1 of a film forming apparatus 100 which will process the wafer W, and the preprocessing is performed by exposing the inside of the processing chamber 1 (step 1) to the preprocessing gas. As for the preprocessing gas, a gas containing at least one of Cl and F, e.g., $ClF_3$ gas, $F_2$ gas, or $Cl_2$ gas is used. As a result of this step, the preprocessing gas exists in the processing chamber 1. The temperature of the preprocessing step may be set to a proper level in accordance with types of preprocessing gases. Preferably, it is set to be within a range from about 250° C. to 450° C. In order to increase a processing throughput, it is preferably set to the same temperature as the temperature of the film forming process, or to a temperature different from the temperature of the film forming process by no more than about ±50° C.

While the preprocessing of the step 1 is being performed, the wafer W to be subjected to film formation may be in a standby state in the load lock chamber 106 or 107 maintained in a vacuums state. Or, the wafer W may be taken from the load-lock chamber 106 or 107 by the support arm 114a or 114b of the transfer device 112 and set in a standby state on the support arm 114a or 114b.

Next, the gate valve G of the processing chamber 1 that has been subjected to the preprocessing is opened, and the wafer W in the standby state is loaded into the processing chamber 1 through the loading/unloading port 39 by the transfer device 112 of the transfer chamber 105 and mounted on the mounting table 3 (step 2).

Then, the gate valve G is closed, and the processing chamber 1 is exhausted to a predetermined vacuum level. The wafer W is heated by the mounting table 3 that has been heated by heat rays emitted from the heating lamp 32 and transmitted through the transmission plate 30. In that state, the Ge raw material gas, the Sb raw material gas and the Te raw material gas are supplied at predetermined flow rates, and a Ge—Sb—Te film is formed on the wafer W (step 3).

In this step, first, the dilute gas, e.g., Ar gas, is supplied at a flow rate ranging from about 100 mL/sec (sccm) to 500 mL/sec (sccm) from the dilute gas supply source 55, and the processing chamber 1 is exhausted by a vacuum pump (not shown) through the gas exhaust port 36 and the gas exhaust line 37. Accordingly, the pressure in the processing chamber 1 is controlled to fall within a range from about 60 Pa to 1330 Pa. At this time, the heating temperature of the wafer W is set to be within a range from, e.g., about 200° C. to 500 C, and preferably set to range from about 300° C. to 400° C.

Then, the actual film formation is carried out while controlling the pressure in the processing chamber 1 to be maintained at a film forming pressure ranging from about 60 Pa to 6650 Pa and the flow rate of the dilute gas, e.g., Ar gas, to range from about 200 mL/sec (sccm) to 1000 mL/sec (sccm). The pressure in the processing chamber 1 is controlled by an automatic pressure controller (APC) (not shown) provided on the gas exhaust line 37.

In that state, the Sb raw material gas is introduced into the processing chamber 1 from the Sb raw material reservoir 53 by having a carrier gas supplied thereto at a predetermined flow rate to bubble therein. In the same manner, the Te raw material gas is introduced into the processing chamber 1 from the Te raw material reservoir 52 by having a carrier gas supplied thereto at a predetermined flow rate to bubble therein. Further, a Ge raw material gas is introduced into the processing chamber 1 from the Ge raw material reservoir 54 at a predetermined flow rate controlled by the mass flow controller (MFC) 63. Hence, a Ge—Sb—Te film having a composition ratio of $Ge_2Sb_2Te_5$ is obtained. At this time, the gas flow rates ($N_2$ equivalent) of the Ge raw material gas, the Sb raw material gas (carrier Ar gas supplied into Sb raw material reservoir) and the Te raw material gas (carrier Ar gas supplied into Te raw material reservoir) are set to, e.g., about 550 mL/min (sccm), 20 mL/min (sccm), and 50 mL/min (sccm), respectively. In that case, the Ge—Sb—Te film may be formed by supplying the Ge raw material gas, the Sb raw material gas and the Te raw material gas simultaneously. Or, the Ge—Sb—Te film may be formed by supplying the Ge raw material gas, the Sb raw material gas and the Te raw material gas alternately. Meanwhile, the Ge raw material gas flow rate ($N_2$ equivalent) is a value obtained by measuring a Ge gas flow rate by using a mass flow controller corrected for an $N_2$ gas.

While the film forming process of the step 3 is being performed, the gas containing at least one of Cl and F exists in the processing chamber 1 by means of the preprocessing of the step 1. Hence, when the Ge raw material gas, the Sb raw material gas and the Te raw material gas are introduced into the processing chamber 1, they react with Cl and F, thereby generating active chloride and/or fluoride having a high vapor pressure. This facilitates the formation of initial nucleus and, accordingly, a continuous film having high smoothness and dense distribution of comparatively small crystal grains is obtained.

Upon completion of the film forming process of the step 3, the supply of the raw materials is stopped, and the processing chamber 1 is purged by a dilute gas. Next, the gate valve G is opened, and the wafer W after the film formation is unloaded from the processing chamber 1 by the transfer device 112 (step 4). Then, the unloaded wafer W is loaded into any one of the load-lock chambers 106 and 107, and the pressure in the load-lock chamber into which the wafer W has been loaded is returned to an atmospheric pressure. Thereafter, the wafer W is accommodated in the carrier C by the transfer device 11. In this manner, the film forming process for a single wafer is completed. Such processing is continuously performed on a plurality of wafers W in the carrier C.

In accordance with the present embodiment, when a Ge—Sb—Te-based film is formed by CVD, the inside of the processing chamber 1 is exposed to a gas containing at least one of Cl and F in a state where a wafer W as a substrate to be processed is not loaded into the processing chamber 1. Then, the wafer W is loaded thereinto, and the gaseous Ge raw material, the gaseous Sb raw material and the gaseous Te raw material are introduced into the processing chamber 1. These raw materials react with Cl and F, thereby generating active chloride and/or fluoride having a high vapor pressure. Therefore, the formation of initial nucleus is facilitated, and a Ge—Sb—Te film having a high smoothness can be obtained.

Hereinafter, test results of actual Ge—Sb—Te film formation will be described.

<Test 1>

In the film forming apparatus of FIG. 1, a temperature of a wall of the processing chamber was set to about 160° C. by a cartridge heater, and a temperature of the mounting table was set to about 360° C. by controlling a lamp power. Further, a circular plate-shaped wafer having a diameter of about 200 mm was loaded into the processing chamber by using the support arm of the transfer device, and a Ge—Sb—Te film was formed under the following conditions. Moreover, tertiary butyl germanium, triisopropyl antimony, diisopropyl tellurium were used as the Ge raw material, the Sb raw material and the Te raw material, respectively. The tertiary butyl germanium was supplied to the processing chamber at a vapor flow rate directly controlled by a mass flow controller installed at a rear end of a raw material container maintained at a room temperature. The triisopropyl antimony was supplied to the processing chamber through bubbling method in which Ar gas supplied at a controlled flow rate as a carrier gas to the raw material container maintained at about 50° C. was made to bubble through the container. The diisopropyl tellurium was supplied to the processing chamber through bubbling method in which Ar gas supplied at a controlled flow rate as a carrier gas to the raw material container maintained at about 35° C. was made to bubble through the container. The mass flow controllers and the lines extending from the raw material containers to the processing chamber were maintained at about 160° C. by heaters.

Hereinafter, the film forming conditions of the Ge—Sb—Te film in Test 1 will be described.

Figure 4:
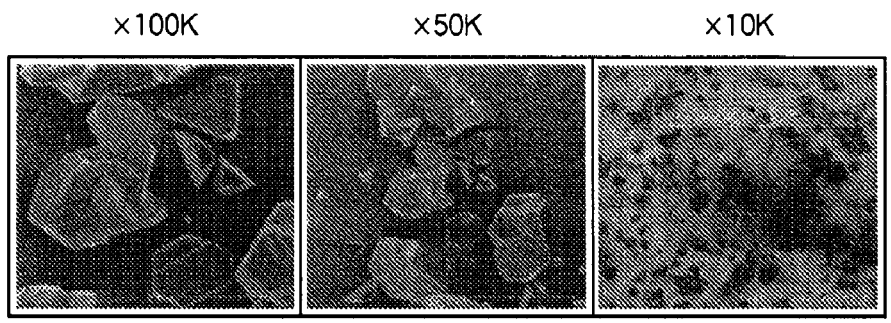
FIG. 4 is a scanning electron microscope image showing a film surface state obtained from Test 1.

Temperature of mounting table: 360° C.
Pressure in processing chamber: 665 Pa
Flow rate of Ge raw material: 550 mL/min (sccm) ($N_2$ equivalent)
Flow rate of Te raw material gas (carrier Ar gas supplied into Te raw material reservoir): 50 mL/min (sccm)
Flow rate of Sb raw material gas (carrier Ar gas supplied into Sb raw material reservoir): 20 mL/min (sccm)
Flow rate of dilute Ar gas: 100 mL/min (sccm)
Flow rate of backside Ar gas: 200 mL/min (sccm)
Film formation time: 90 sec A film composition ratio, i.e., a Ge/Sb/Te ratio, measured by X-ray fluorescent analysis (XRF) was about 22/26/53 (at %), and an XRF equivalent thickness of the Ge—Sb—Te film was measured to be about 151 nm. As shown in the surface texture in the scanning electron microscope (SEM) images of FIG. 4, the Ge—Sb—Te film had poor smoothness due to sparse distribution of crystal grains having a strong crystal habit.

<Test 2>

Before a Si wafer as a wafer W was loaded into the processing chamber, the preprocessing was performed by exposing the inside of the processing chamber to the preprocessing gas under the following conditions by using the same apparatus as that used in Test 1. Thereafter, a Ge—Sb—Te film was formed as in Test 1.

Figure 5:
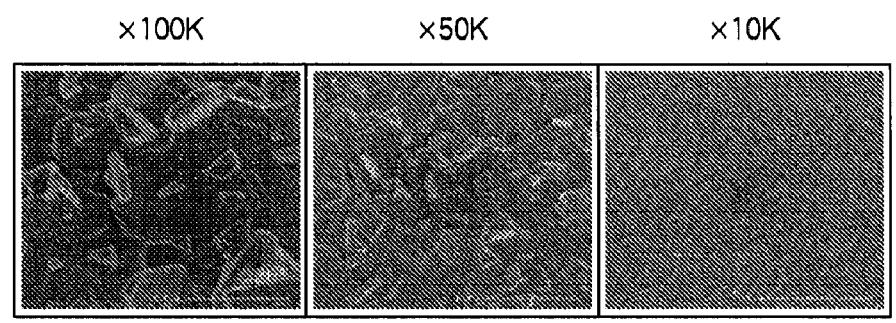
FIG. 5 is a scanning electron microscope image showing a film surface state obtained from Test 2.

The preprocessing conditions are described as follows.
Temperature of mounting table: 300° C.
Pressure in processing chamber: 612 Pa
(Flow Rate of Preprocessing Gas)
Flow rate of $ClF_3$ gas: 400 mL/min (sccm)
Flow rate of Ar gas (dilute gas): 400 mL/min (sccm)
Processing time: 1800 sec A film composition ratio, i.e., a Ge/Sb/Te ratio, measured by X-ray fluorescent analysis (XRF) was about 19/26/55 (at %), and an XRF equivalent thickness of the Ge—Sb—Te film was measured to be about 196 nm. As shown in the surface texture in the scanning electron microscope (SEM) images of FIG. 5, the Ge—Sb—Te film had good smoothness.

<Test 3>

Before a $SiO_2$ wafer as a wafer W was loaded into the processing chamber, the preprocessing was performed by exposing the inside of the processing chamber to the preprocessing gas under the following conditions. Thereafter, a Ge—Sb—Te film was formed as in Test 1.

Figure 6:
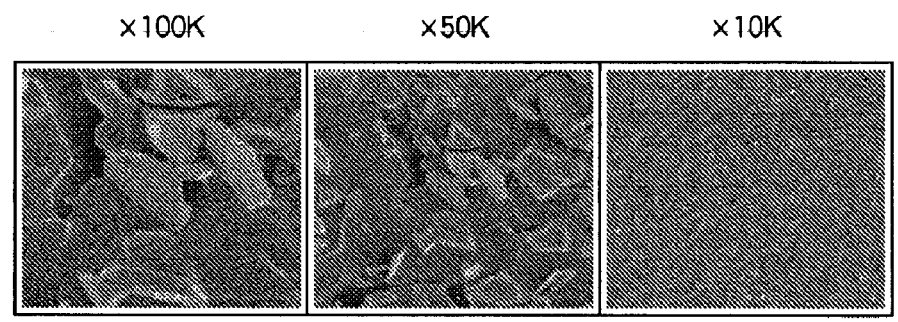
FIG. 6 is a scanning electron microscope image showing a film surface state obtained from Test 3.

The preprocessing conditions are described as follows.
Temperature of mounting table: 360° C.
Pressure in processing chamber: 665 Pa
(Flow Rate of Preprocessing Gas)
Flow rate of $ClF_3$ gas: 400 mL/min (sccm)
Flow rate of Ar gas (dilute gas): 600 mL/min (sccm)
Processing time: 600 sec A film composition ratio, i.e., a Ge/Sb/Te ratio, measured by X-ray fluorescent analysis (XRF) was about 20/26/54 (at %), and an XRF equivalent thickness of the Ge—Sb—Te film was measured to be about 197 nm. The surface texture of the formed film is shown in FIG. 6, and the formed film had good smoothness same as that shown in FIG. 5. In Test 3, the processing throughput was able to be increased because the temperature of the preprocessing was set to be the same temperature as the temperature of the film forming process.

<Test 4>

As in Test 3, before a $SiO_2$ wafer was loaded into the processing chamber, the preprocessing was performed by exposing the inside of the processing chamber to the preprocessing gas under the same conditions as those of Test 3 except that the processing time was set to about 60 sec. Thereafter, a Ge—Sb—Te film was formed as in Test 1.

Figure 7:
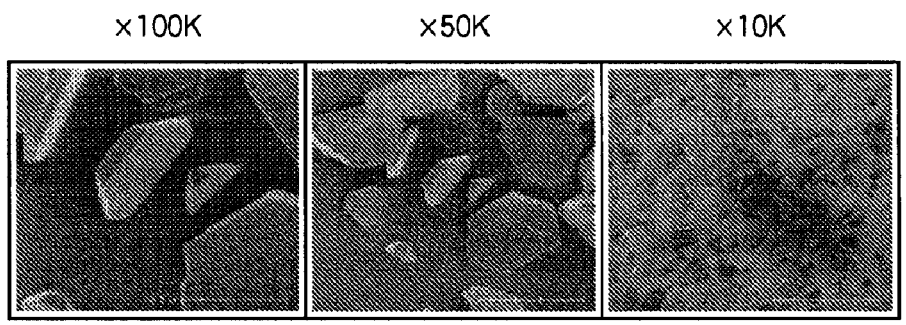
FIG. 7 is a scanning electron microscope image showing a film surface state obtained from Test 4.

A film composition ratio, i.e., a Ge/Sb/Te ratio, measured by X-ray fluorescent analysis (XRF) was about 26/23/52 (ata), and an XRF equivalent thickness of the Ge—Sb—Te film was measured to be about 111 nm. As shown in the surface texture in the scanning electron microscope (SEM)

images of FIG. 7, the formed film had poor smoothness compared to that of the formed film in Test 3. From this, it is clear that the continuity of the film is improved as the preprocessing time is increased, and this results in improvement of the smoothness and increase of the deposition rate of the film.

Then, the effect obtained by changing the type of the substrate to be processed (Si wafer and SiO$_2$ wafer) was examined.

<Test 5>

Before a Si wafer was loaded into the processing chamber, the preprocessing was performed by exposing the inside of the processing chamber to a preprocessing gas under the same conditions as those of Test 3 except that the flow rate of ClF$_3$ gas was set to about 200 sccm. Next, a Ge—Sb—Te film was formed under the same film forming conditions as those of Test 1.

Figure 8:
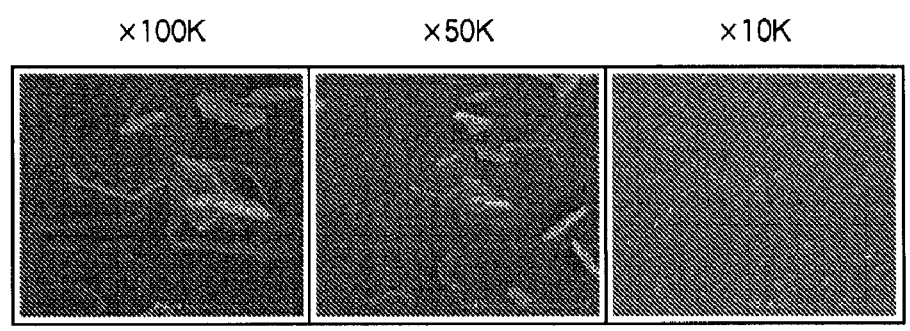
FIG. 8 is a scanning electron microscope image showing a film surface state obtained from Test 5.

A film composition ratio, i.e., a Ge/Sb/Te ratio, measured by X-ray fluorescent analysis (XRF) was about 22/25/53 (at %), and an XRF equivalent thickness of the Ge—Sb—Te film was measured to be about 181 nm. At this time, the surface texture shown in the scanning electron microscope (SEM) images of FIG. 8 was obtained.

<Test 6>

A Ge—Sb—Te film was formed under the same conditions (preprocessing conditions and film forming conditions) as those of Test 5 except that a SiO$_2$ wafer was used as a substrate to be processed loaded into the processing chamber.

Figure 9:
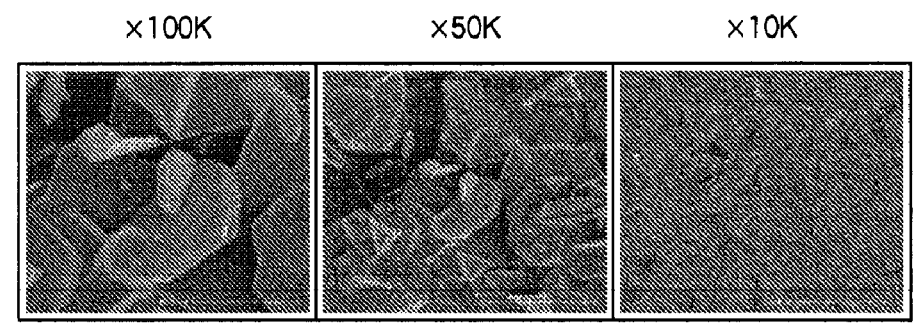
FIG. 9 is a scanning electron microscope image showing a film surface state obtained from Test 6.

A film composition ratio, i.e., a Ge/Sb/Te ratio, measured by X-ray fluorescent analysis (XRF) was about 20/26/54 (at %), and an XRF equivalent thickness of the Ge—Sb—Te film was measured to be about 163 nm. At this time, the surface texture shown in FIG. 9 was obtained.

The results of Tests 5 and 6 show that even when the processing chamber is processed under the same preprocessing conditions, the continuity of the film formed on the substrate is improved and the deposition rate of the film is increased in the case of the Si wafer compared to the case of the SiO$_2$ wafer.

The results of Tests 3 and 6 performed under the same conditions except for the ClF$_3$ gas flow rate in the preprocessing step (test 3: ClF$_3$ gas flow rate of about 400 sccm/partial pressure of about 266 Pa) (test 6: ClF$_3$ gas flow rate of about 200 sccm/partial pressure of about 166 Pa) show that the continuity of the film is improved and the deposition rate of the film is increased when the ClF$_3$ partial pressure is higher.

The present invention can be variously modified without being limited to the above-described embodiments. For example, in the above-described embodiments, the preprocessing is performed before the substrate is loaded into the processing chamber. However, the preprocessing may be performed after the substrate is loaded into the processing chamber, so that the preprocessing of the chamber and the preprocessing of the substrate can be performed simultaneously. At this time, if the preprocessing of the substrate needs to be performed at a temperature lower than a temperature of the preprocessing of the processing chamber, the lifter pins are controlled to lift the substrate from the mounting table. In this case, the substrate can be maintained at a temperature lower by an amount ranging from about 50° C. to 100° C. than a temperature of the mounting table by setting the processing pressure to a level lower than or equal to about 266 Pa and preferably lower than or equal to about 133 Pa.

Besides, in the above-described film forming apparatus, the substrate is heated by the lamp, for example. However, the substrate may be heated by a resistance heater. In addition, the above-described embodiments have described the example in which the multi-chamber type processing system has four film forming apparatuses. However, the number of the film forming apparatuses is not particularly limited, and a single film forming apparatus may be used. Further, the above-described embodiments have described the example in which a Ge—Sb—Te film is applied to a phase-change film of a PRAM. However, it can also be applied to another film such as a recording layer of a phase-change type optical recording medium. Thus, the substrate is not limited to a semiconductor substrate, and it is possible to use various substrates such as a glass substrate, a resin substrate and the like.

What is claimed is:

1. A film forming method comprising:
    exposing the inside of a processing chamber to a gas containing at least one of Cl and F before loading a substrate into the processing chamber;
    loading a substrate into the processing chamber; and
    introducing a gaseous Ge raw material, a gaseous Sb raw material and a gaseous Te raw material into the processing chamber where the substrate is loaded and forming a Ge—Sb—Te film formed of Ge$_2$Sb$_2$Te$_5$ on the substrate by CVD.

2. The film forming method of claim 1, wherein when the inside of the processing chamber is exposed to the gas containing at least one of Cl and F, ClF$_3$ gas is used as the gas containing at least one of Cl and F.

3. The film forming method of claim 1, wherein the formation of the Ge—Sb—Te film is performed at a temperature ranging from about 200° C. to 500° C.

4. The film forming method of claim 3, wherein the exposure of the inside of the processing chamber to the gas containing at least one of Cl and F is performed at a temperature falling within a range of about ±50° C. from the temperature for the formation of the Ge—Sb—Te film.

5. The film forming method of claim 1, wherein the Ge raw material, the Sb raw material and the Te raw material are compounds having an alkyl group.

6. A non-transitory computer readable storage medium storing a program for controlling a film forming apparatus, wherein the program, when executed on a computer, controls the film forming apparatus to perform a film forming method of a Ge—Sb—Te film which includes: exposing the inside of a processing chamber to a gas containing at least one of Cl and F before loading a substrate into processing chamber; loading a substrate into the processing chamber; and introducing a gaseous Ge raw material, a gaseous Sb raw material and a gaseous Te raw material into the processing chamber where the substrate is loaded and forming a Ge—Sb—Te film formed of Ge$_2$Sb$_2$Te$_5$ on the substrate by CVD.

* * * * *